United States Patent [19]

Yoshida

[11] Patent Number: 4,504,749
[45] Date of Patent: Mar. 12, 1985

[54] DELAY PULSE GENERATING CIRCUIT

[75] Inventor: Kenji Yoshida, Saitama, Japan

[73] Assignee: Takeda Riken Co., Ltd., Tokyo, Japan

[21] Appl. No.: 400,036

[22] Filed: Jul. 20, 1982

[30] Foreign Application Priority Data

Jul. 20, 1981 [JP] Japan .................. 56-113224

[51] Int. Cl.³ .................. H03K 5/13; H03K 5/159
[52] U.S. Cl. .................. 307/590; 307/602; 307/603; 307/271
[58] Field of Search .......... 307/590, 594, 595, 602, 307/603, 597, 271; 328/55

[56] References Cited

U.S. PATENT DOCUMENTS

| 2,931,981 | 4/1960 | Schabauer | 328/55 |
| 3,150,324 | 9/1964 | Hallden et al. | 328/55 |
| 3,712,994 | 1/1973 | Graziani | 307/603 |

Primary Examiner—Stanley D. Miller
Assistant Examiner—B. P. Davis
Attorney, Agent, or Firm—Staas & Halsey

[57] ABSTRACT

A delay signal generating circuit includes feedback loops and components for selectively setting the delay time of a delay unit in one of the loops. The circuit can be used to provide an adjustable delay to a signal being propagated therethrough, and the delay unit can be bypassed.

18 Claims, 7 Drawing Figures 4,504,749

DELAY PULSE GENERATING CIRCUIT

FIELD OF THE INVENTION

This invention relates to delay signal generating circuits which generate various kinds of timing signals, and more particularly to a delay signal generating circuit the delay time of which is automatically adjusted with high accuracy, and which is used as part of a timing generator of a test system for integrated circuits.

BACKGROUND OF THE INVENTION

In testing a semiconductor memory for example, it is necessary to generate timing signals which have various phase (delay time) differences. Waveforms shown on device data sheets describe a complex interrelationship among input and address data, clock and control signals, and output data. These waveforms, usually with edges specified to within one nanosecond, must be accurately reproduced if a test system is to do its job. For example, an integrated circuit test system which contains a delay signal generating circuit of the present invention is able to generate input waveforms whose edges can be programmed in 100 picosecond steps over the range from 0 to 100 microseconds and to deliver them accurately to the pins of the memory under test. For generating these timing signals, a fixed period clock is provided to delay circuits whose delay time resolution is better than the clock period. Examples of such circuits are illustrated in FIGS. 1a and 1b.

In FIG. 1a, each reference clock pulse Pa is provided to each input of the variable delay circuit 2a, 2b, 2c, 2d, 2e, 2f from the pulse generator 1. Each delay circuit provides a delay pulse Pb to Pg as in FIG. 2, each of which is delayed by a respective predetermined time. Multiplexer 3 selects a desired signal from Pb to Pg and outputs the delayed signal Po at the output terminal 5.

In FIG. 1b, the variable delay circuits 2a to 2f are connected in series. Each delay circuit has in parallel a switch circuit to selectively add the respective delay time to the total delay time of the series connection. As mentioned above, the minimum delay time of these circuits is smaller than the time interval between the clock pulses Pa, to avoid the timing signal resolution becoming limited by the clock period or resolution.

Each variable delay circuit 2a to 2f may be constructed in a known manner as illustrated in FIG. 3. Here the delay time is varied by the voltage change at the input of the delay unit 7 caused by the potentiometer 3. The delay unit 7 is usually formed with a resistance and a variable capacitance diode, forming an RC network. The relay circuit 6 is connected between the input 4 and the output 5 via the OR circuit 19 to change from the delayed to the nondelayed state or vice versa.

In this known means for adjusting a delay time, it is necessary to adjust the potentiometer 3 manually to search for a suitable voltage for the delay unit 7. When adjusting the potentiometer 3, both the reference clock and the delayed pulse are displayed on an oscilloscope screen, and by observing the time difference between these two pulses, the desired delay time is adjusted by adjusting the potentiometer 3 to make the time difference a suitable amount.

Because the measurement and adjustment are made by use of an oscilloscope, the accuracy of the delay time depends on the accuracy of the oscilloscope. Also, error arising from reading the difference off the oscilloscope screen makes the accuracy even worse. Further, it is time consuming to adjust each delay circuit manually, because a typical integrated circuit test system contains many delay circuits of various form.

SUMMARY OF THE INVENTION

It is an object of the present invention to provide a delay pulse generating circuit the delay time of which can be adjusted with high accuracy.

It is a further object of the present invention to provide a delay pulse generating circuit the delay time of which can be automatically adjusted and with high speed.

With the delay pulse generating circuit of the present invention, when adjusting the delay time, a delayed output of the variable delay circuit is fed back to the input of the variable delay circuit and triggers a monostable multivibrator, thus making the variable delay circuit oscillate. Since the oscillation frequency is determined by the delay time of the feedback loop, the delay time of the variable delay circuit is determined by measuring the frequency of the oscillation. The measured delay time and the desired delay time are then compared to each other, and the difference between the two delay times is calculated. The delay time of the delay circuit is then adjusted by changing the control data to make the abovementioned difference become zero. When the difference reaches zero, the desired delay time is acquired in the variable delay circuit. In this invention, this procedure is performed for instance by a time interval counter, a calculator and controler, and a digital-analog converter.

According to the present invention, the sequence of adjusting a delay time may be accomplished automatically and by digital techniques, so that it is possible to adjust the delay time with accuracy and high speed.

BRIEF DESCRIPTION OF THE DRAWINGS

FIG. 2 is a timing diagram illustrating the operation of FIG. 1a.

DETAILED DESCRIPTON OF THE PREFERRED EMBODIMENTS

Figure 1A:
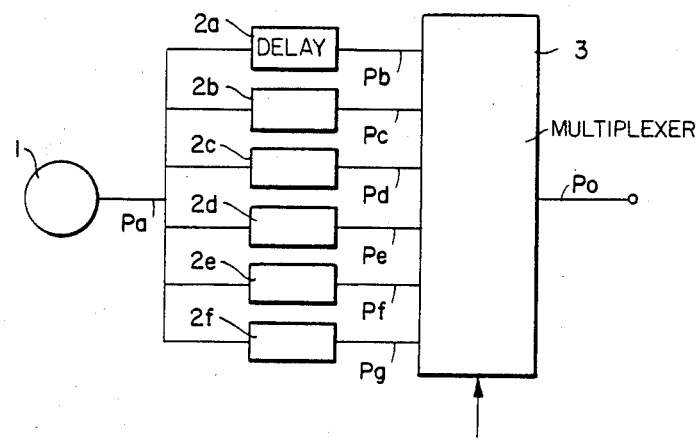
FIGS. 1a and 1b are examples of block diagrams of the delay pulse generating circuits for which the present invention is useful.
Figure 1B:
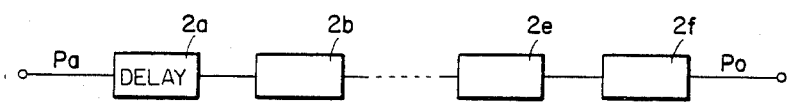
Figure 2:
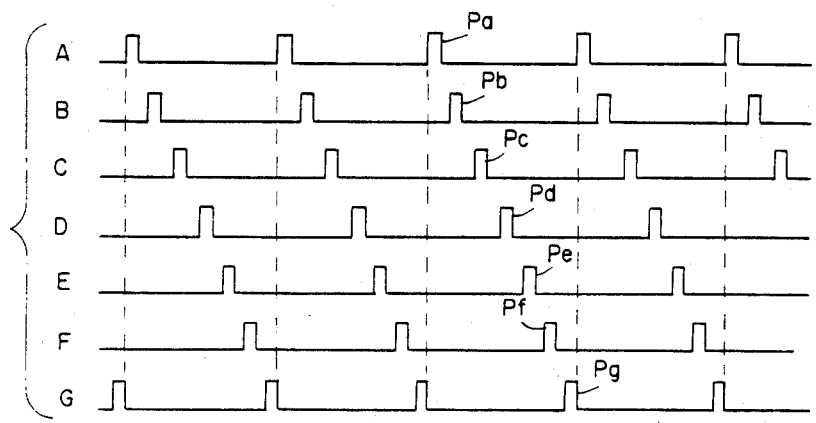
Figure 3:
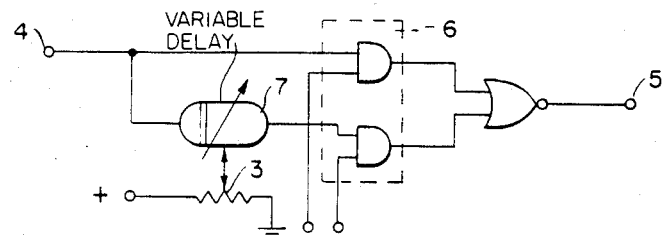
FIG. 3 is a block diagram of each variable delay circuit 2a to 2f in FIGS. 1a and 1b.
Figure 4:
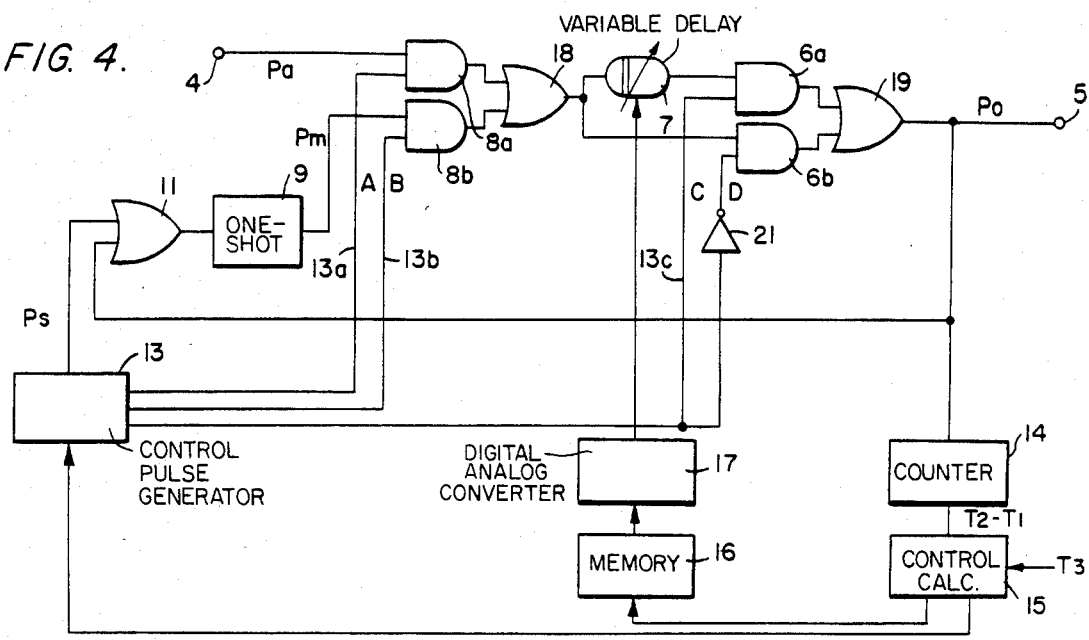
FIG. 4 is a block diagram of an embodiment of the present invention.

FIG. 4 illustrates a block diagram of a preferred embodiment of the present invention. Input terminal 4 is connected to an input of an AND gate 8a which is closed when adjusting a delay time and open after completion of the adjustment. A one-shot pulse Pm from a monostable multivibrator 9 is provided to an input of an AND gate 8b. Both outputs of the AND gates 8a and 8b are connected to the two inputs of an OR gate 18. The output of the OR gate 18 is connected to a delay unit 7 and also to an input of an AND gate 6b. The output of the delay unit 7 is coupled to an input of an AND gate 6a. The AND gates 6a and 6b are controlled inversely (in opposite phase) to each other. That is, when the signal from the OR gate 18 is to be transmitted through delay unit 7, the AND gate 6a is open and the AND gate 6b is closed, and, when the signal from the OR gate 18 is to be transmitted without the delay of the delay unit 7, the AND gate 6a is closed and the AND gate 6b is open. Both outputs of the AND gates 6a, 6b are connected to the two inputs of an OR gate 19 which provides output pulses Po to an output terminal 5. Each output pulse Po is also provided to an input of a counter 14 and to an input of an OR gate 11. Each output pulse Po triggers the monostable multivibrator 9 by means of the OR gate 11. Thus the feedback loop causes oscillation.

The counter 14 counts the time interval of the oscillation signal and provides the measured result to a control calculator 15. The control calculator 15 performs the required calculation and also controls the entire sequence of the delay time adjustment of the circuit. The data from the control calculator 15 is provided to a memory 16 which stores the data and provides an analog voltage to the delay unit 7 whose delay time is varied according to the value of the analog voltage. A control pulse generator 13 generates a start pulse Ps and switching signals according to the control command signals from the control calculator 15. Each start pulse Ps is provided to one input of the OR gate 11. The switching signal A is provided to the AND gate 8a by means of line 13a, and switching signal B is provided to the AND gate 8b by means of the line 13b. The switching signal C is provided to the AND gate 6a by means of the line 13c, and switching signal D is provided to the AND gate 6b by means of inverter 21.

Figure 5:
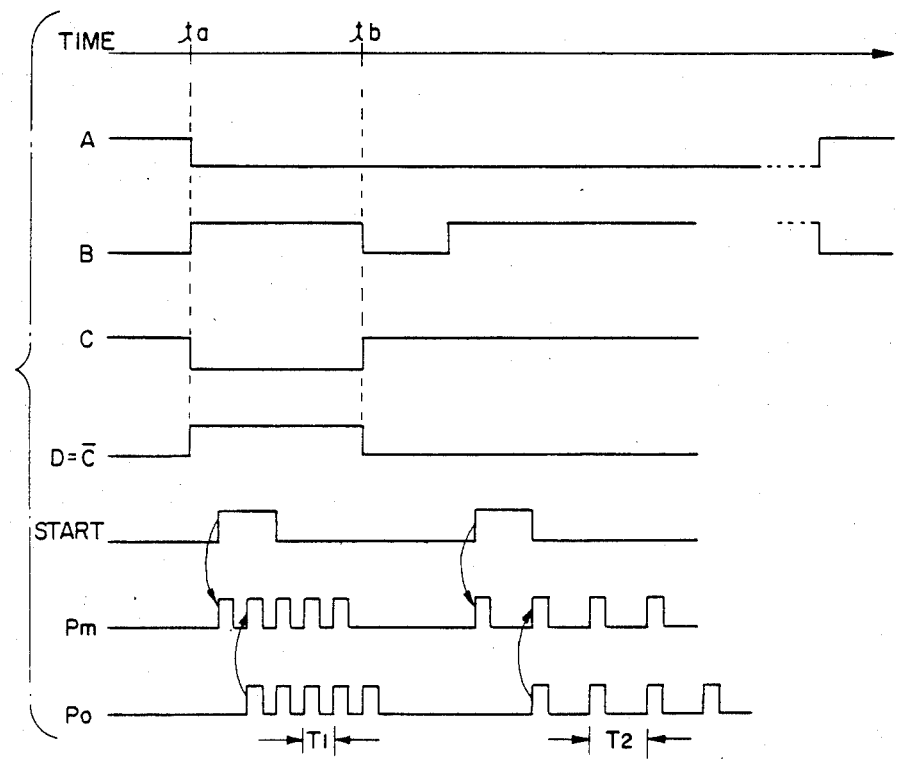
FIG. 5 shows a timing diagram for the embodiment of FIG. 4.

After completion of the delay time adjustment, the switching signal A from the control pulse generator 13 is set to "1", and thus the AND gate 8a is opened. During the adjustment of the delay time, the AND gate 8a is closed and the input signal at input terminal 4 is inhibited. In the following explanation, the delay time which is to be adjusted is referred to as T3 for convenience. At the beginning of the delay time adjustment, the control calculator 15 provides command signals to the control pulse generator 13. According to these command signals, the control pulse generator 13 changes switching signal A to "0" and switching signal B to "1" at time ta as illustrated in FIG. 5. Thus the AND gate 8a is closed and the AND gate 8b is opened, and the one-shot pulses from the monostable multivibrator 9 are permitted to go through the variable delay circuit and are outputted at the output terminal 5.

Each output pulse Po is also provided to the input of the monostable multivibrator 9 via the OR gate 11 to trigger the monostable multivibrator 9. Thus the circuit constitutes a feedback loop, and if the monostable multivibrator 9 is triggered initially by an appropriate signal, such as Ps, this feedback loop begins to oscillate. There are two states of the feedback loop in this variable delay circuit according to the switching signals C and D. In one state, the delay unit 7 is not included in the feedback loop (hereafter this feedback loop is called the first loop), and in the other, the delay unit 7 is included in the feedback loop (hereafter this feedback loop is called the second loop).

At time ta, as in FIG. 5, the control pulse generator 13 changes the switching signal C to "0", and thus the switching signal D to "1", according to the command signal from the control calculator 15. Since the AND gate 6b becomes open and the AND gate 6a is closed by the switching signals C and D, so that the delay unit 7 is not included in the feedback loop, the feedback loop is in the first loop state. After establishing the first loop, the control pulse generator 13 provides a start pulse Ps to the monostable multivibrator 9, according to the command signal from the control calculator 15. The monostable multivibrator 9 is triggered by the rising edge of the start pulse Ps and generates a one-shot pulse Pm at its output. This one-shot pulse passes through AND gate 8b, OR gate 18, AND gate 6b, OR gate 19 and appears at the output terminal 5.

Further, the one-shot pulse passes through the OR gate 11 and triggers the monostable multivibrator 9. Thus the monostable multivibrator 9 generates the one-shot pulse Pm again and this pulse is again fed back to trigger the monostable multivibrator 9. Therefore the loop begins to oscillate as shown by the waveform Pm in FIG. 5. The oscillation frequency is determined by the propagation delay time of each of the AND gates 8b, 6b and OR gates 18, 19, 11, and of the transmission lines used in the feedback loop. The oscillation signal Po is also applied to the counter 14. In this embodiment the counter 14 is an 8-bit binary counter and provides the measured data T1 to the control calculator 15.

After completion of the abovementioned procedure, the switching signal B becomes "0" at time Tb according to the command signal from the control calculator 15. Since both AND gates 8a and 8b are closed, any input signals ps and one-shot pulses Pm from the monostable multivibrator 9 are inhibited, so that the oscillation in the first loop is stopped and no erroneous signal appears at the output terminal 5 and at the counter 14. The control pulse generator 13 then changes the switching signal C to "1" and the switching signal D to "0", according to the command signal from the control calculator 15, at time Tb in this embodiment. After stopping the oscillation, the switching signal B becomes "1" again according to the command from the control calculator 15, and the variable delay circuit again forms the feedback loop. This time the feedback loop is in the second loop state, which includes delay unit 7. After that, the control pulse generator 13 provides a start pulse Ps to the monostable multivibrator 9 which generates the one-shot pulse Pm at its output. The one-shot pulse Pm from the monostable multivibrator 9 passes through AND gate 8b, OR gate 18, delay unit 7, AND gate 6a and OR gates 19 and 11, and is fed back to the input of the monostable multivibrator 9. Consequently, the second loop starts to oscillate in the same way as the first loop. The oscillation frequency depends on the propagation delay time of each of the AND gates 8b, 6a, OR gates 18, 19, 11, and of the transmission lines used in this feedback loop, and also on the propagation delay time of the delay unit 7. In this case, as illustrated in waveforms Pm and Po of FIG. 5, the oscillation frequency is lower than in the case of the first loop, because the delay time of the delay unit 7 is included in the total delay time of the feedback loop. The output signal Po is provided to the counter 14 and its time interval T2 is measured. The measured 8 bit data is provided to the control calculator 15 from the counter 14.

In this embodiment, the control calculator 15 includes a microcomputer to perform the necessary calculations and to control the procedure of the delay time adjustment according to previously programmed instructions. The 8-bit data specifying the desired delay time T3 is applied to the control calculator 15 from, for example, an external keyboard. In the control calculator 15, the time difference (T2−T1) is calculated and compared to the desired value T3.

The reason for calculating (T2−T1) is to acquire the delay time of the delay unit 7 only. Although the propagation delay time difference between the first loop and the second loop are caused by the delay unit 7, AND gates 6a and 6b, and the transmission line of each loop, it is possible to ignore the difference between the delays of the AND gates 6a and 6b, and between the delays of the two transmission lines, by using the same components for both loops. Alternatively, a component with a known delay time may be included in only one of the loops, or between the input and output terminals of the circuit but not within either loop, and the delay time of this further component can be compensated for in setting the desired delay time of the delay unit of the circuit. Thus the calculated value (T2−T1) can be made to correspond only to the delay time of the delay unit 7.

The control calculator 15 provides 8-bit control data to the memory 16, and thus to the digital analog converter 17, to cause the difference between (T2−T1) and T3 to become zero. The memory 16 stores the control data from the control calculator 15 and provides the data to the digital analog converter 17. The digital analog converter 17 has an 8-bit resolution in this embodiment, converts the 8-bit data to a corresponding analog voltage, and provides the analog voltage to the delay unit 7. According to the analog voltage from the digital analog converter 17, the delay time in the delay unit 7 is changed. Thus the time interval T2 is also changed and is measured again by the counter 14, and the time difference (T2−T1) is again calculated and compared to T3 by the control calculator 15. The control calculator 15 again provides the 8-bit control data to the memory 16 and thus to the digital analog converter 17 to reduce the difference between (T2−T1) and T3. This procedure is repeated until the difference reaches zero, so that the desired delay time T3 is acquired in delay unit 7.

Figure 6:
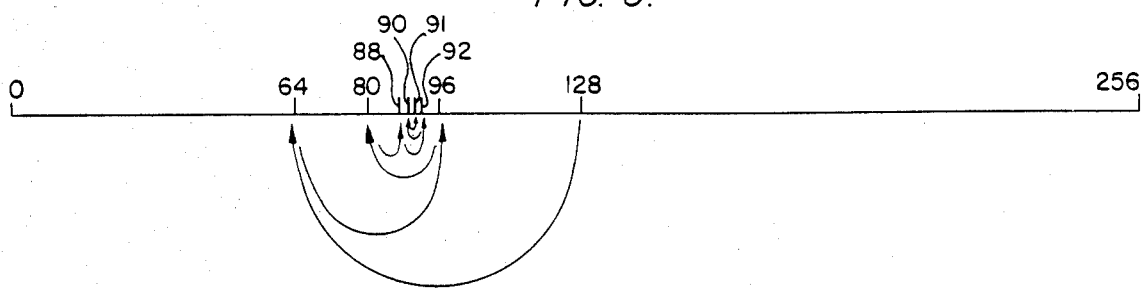
FIG. 6 shows an example of the sequence for arriving at the desired value for the delay time, according to an embodiment of the present invention.

More details of the procedure of making the above-mentioned time difference zero are as follows. This procedure is usually called a binary search. The binary search is a search in which a set of items is divided into two parts, one part is rejected, and the process is repeated on the accepted part until those items with the desired property are found. For convenience, the following explanation of the adjusting procedure for the desired delay time is made in decimal notation. Since the digital analog converter 17 and the control data from the control calculator are comprised of 8-bits, this adjusting circuit has 256 states in decimal notation. For example, assume the desired delay time T3 to be acquired corresponds to the digital analog converter 17 being set at 91, as indicated in FIG. 6. First, the control calculator 15 provides the control data (0+256)/2=128 to the digital analog converter 17 via the memory 16. Thus the corresponding data for (T2−T1) calculated in the control calculator is 128, and this data is compared to the desired delay time T3 which is 91. Since (T2−T1) is greater than T3, the part higher than (0+256)/2=128, that is, the region 129 to 256, is rejected. Then the control calculator 15 provides (0+128)/2=64 to the digital analog converter 17, and again (T2−T1) and T3 are compared. Since 64 is less than 91, the part below 64, that is, the region 0 to 63, is rejected. These procedures are illustrated in FIG. 6.

Next, the control calculator 15 provides (64+128)/2=96 to the digital analog converter 17, and by comparison, 96 being greater than 91, the part above 96, that is, the region 97 to 128, is rejected. Then, (96+64)/2=80 is provided to the digital analog converter 17, and since 80 is smaller than 91, the region 64 to 79 is rejected. Next, (80+96)/2=88 is provided, and since it is less than 91, the region 80 to 88 is rejected. Next, (88+96)/2=92 is provided, and since 92 is greater than 91, the region 93 to 96 is rejected. Then, (92+88)/2=90 is provided, and since 90 is smaller than 91, the region 88 to 89 is rejected. Finally, (90+92)/2=91 is provided and the adjustment is completed.

Since the data required for the delay unit 7 is stored in the memory 16, it is possible, after finishing the adjustment of one variable delay circuit, to disconnect counter 14 and control calculator 15 to be used to adjust the other variable delay circuits.

In this invention, if the delay time of the delay unit 7 is controllable with digital signals, such as a tap changing type delay unit, then the digital analog converter 17 is not necessary.

Although the above explanation is for adjusting one variable delay circuit, it is possible to adjust more than two variable delay circuits by using a multiplexer.

I claim:

1. A delay circuit for transmitting a pulse with a selectable delay between input and output terminals thereof, said circuit comprising
    a signal line connecting between said input and output terminals, along which the pulses to be delayed are transmitted,
    a delay unit connected in said signal line, the delay time of said delay unit being variable to provide said selectable delay between said input and output terminals,
    a bypass line connected in parallel with a portion of said signal line which includes said delay unit, to selectively allow pulses provided to said signal line to bypass said portion of said delay line including said delay element,
    feedback means for feeding back pulses corresponding to pulses at said output terminal to said signal line at a point that is no further along said signal line than the input to said portion of said signal line
    switching means for switching the feedback pulses between said portion of said signal path and said bypass line, for transmitting the feedback pulses to said output terminal,
    operating means for controlling said feedback means and switching means, and for adjusting said delay time of said delay unit, wherein said selected delay is provided based on comparison of the periods for repeated transmission of respective pulses from said output terminal via said feedback means and along each of said portion of said signal line and said bypass line.

2. The circuit of claim 1, wherein the delay time for propagation of the pulses from said input terminal to said point along said signal line, at which the feedback pulses are provided to said signal line, is known and taken into account in setting said delay time of said delay unit.

3. The circuit of claim 1, comprising at least one of identical and common components in said portion of said signal line and said bypass line.

4. The circuit of claim 1 or 3, said feedback means comprising a monostable vibrator the output of which provides said feedback pulses.

5. The circuit of claim 1, 2 or 3, comprising said delay unit requiring an analog signal for controlling said delay time thereof, said operating means comprising a counter for counting values corresponding to each said period of repeated transmission and for providing a digital output corresponding to the difference between the respective periods corresponding to the feedback pulses being switched to both said part of the signal line including said delay unit and said bypass line, and digital logic circuitry for providing in digital form a delay control signal for controlling the delay time of said delay unit, and a digital-to-analog converter for converting said delay control signal into said analog signal for varying the delay time of said delay unit.

6. The circuit of claim 1, 2 or 3 said delay unit comprising means for receiving a delay control signal in digital form for varying said delay time thereof, and said operating means comprising digital logic circuitry for providing said delay control signal in digital form.

7. The circuit of claim 1, 2 or 3, said operating means comprising a control pulse generator responsive to the switching between said portion of said signal path with the delay unit and said bypass line, and for supplying a start pulse for supplying an initial pulse for providing said pulses at said output terminal for said repeated transmission.

8. The circuit of claim 1, 2, 3 or 4, wherein said operating means operates according to a binary search procedure to control said delay time of said delay unit to provide said selected delay between said input and output terminals.

9. The circuit of claim 1, 2 or 3, said switching means comprising a first AND gate located in said signal line so that said input terminal provides a first input thereinto, a second AND gate having as a first input the output of said feedback means, a first OR gate located in said signal line and having as inputs the outputs of said first and second AND gates, the output of said first OR gate corresponding to both the input to said portion of the signal line including said delay unit and the input to said bypass line, a third AND gate located in series with said delay unit in said portion of said signal line and a fourth AND gate which is identical to said third AND gate located in said bypass line, and a second OR gate having as inputs the outputs of said third and fourth and gates, the output of said second OR gate being connected to said output terminal, wherein said operating means provides respective gating input signals to said AND gates for said switching by said switching means.

10. The circuit of claim 9, wherein said operating means operates according to a binary search procedure to control said delay time of said delay unit to provide said selected delay in the transmission of pulses between said input and output terminals.

11. The circuit of claim 1, said operating means including a counter for counting the periods of said repeated transmission along both said portions of said signal line and said bypass line, control means for outputting control signals for varying the delay unit and to operate said feedback means and said switching means, based on the difference between said periods of the repeated transmissions.

12. A delay circuit for selectively transmitting a pulse along two alternate paths from an input terminal of said circuit to an output terminal thereof, with a selected delay time along a first one of said alternate paths with respect to transmission along the second alternate path, said circuit comprising an adjustable delay unit located in said first alternate path, feedback connection means for feeding back a pulse on said output terminal to a further terminal corresponding to said input terminal for alternately forming a feedback loop with each of said alternate paths to cause oscillation of said circuit with a respective frequency for each said alternate path, switching means for alternately forming said feedback loop with each of said alternate paths, and means for determining a difference corresponding to the difference of the two respective frequencies and for adjusting said adjustable delay unit to cause said difference to change to provide a desired value for said delay time of the delay circuit.

13. The circuit of claim 12, said means for determining and adjusting including a counter connected to said output terminal for measuring the period of each said oscillation frequency, and a control calculator for computing said difference and for causing said difference to change to provide said desired value of said delay time of the delay circuit.

14. The circuit of claim 13, said control calculator causing said difference to change to provide said desired value of the delay circuit by a binary search method.

15. The circuit of claim 13 or 14 said means for determining and adjusting comprising said counter being connected to said output terminal, said control calculator having a first output for adjusting said delay unit and a second output for controlling said adjusting of the adjustable delay unit, wherein said difference is formed for a series of values of said delay times of said delay circuit.

16. The circuit of claim 15, said means for determining and adjusting comprising a memory receiving said first output of said control calculator for storing each said first output of the control calculator.

17. The circuit of claim 15, said means for determining and adjusting including a control pulse generator for receiving said second output of the control calculator, and for generating a plurality of output pulses responsive thereto for controlling said forming of said feedback loop with said two alternate paths, and for generating a start pulse for beginning the oscillation for each said feedback loop for each said delay time of said delay unit.

18. The circuit of claim 17 comprising a monostable vibrator connected in said feedback connection means for providing pulses for each said oscillation, wherein each said oscillation is started by one of said start pulses being input into said mono-stable vibrator.

* * * * *